(12) United States Patent
Eguchi

(10) Patent No.: US 8,180,524 B2
(45) Date of Patent: May 15, 2012

(54) DIAGNOSIS APPARATUS AND METHOD FOR DIAGNOSING CONNECTION STATE OF VEHICLE ANTENNA

(75) Inventor: Takashi Eguchi, Kanagawa (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 1037 days.

(21) Appl. No.: 11/822,351

(22) Filed: Jul. 5, 2007

(65) Prior Publication Data

US 2008/0007432 A1 Jan. 10, 2008

(30) Foreign Application Priority Data

Jul. 6, 2006 (JP) ................................. 2006-186611

(51) Int. Cl.
*G01M 17/00* (2006.01)
*G06F 7/00* (2006.01)
*G06F 19/00* (2006.01)
(52) U.S. Cl. ..................... 701/34.4; 701/31.5; 701/31.7; 701/33.2; 701/33.4; 701/33.5; 701/33.9
(58) Field of Classification Search ........................ None
See application file for complete search history.

(56) References Cited

U.S. PATENT DOCUMENTS

| | | | | |
|---|---|---|---|---|
| 5,825,164 A | * | 10/1998 | Williams | 323/255 |
| 5,945,906 A | * | 8/1999 | Onuma | 340/5.62 |
| 6,267,706 B1 | * | 7/2001 | Kuroda et al. | 477/107 |
| 6,414,778 B1 | * | 7/2002 | Hori | 359/204.1 |
| 6,437,577 B1 | | 8/2002 | Fritzmann et al. | |
| 6,657,595 B1 | * | 12/2003 | Phillips et al. | 343/702 |
| 6,669,165 B2 | * | 12/2003 | Burke | 251/102 |
| 7,084,808 B2 | * | 8/2006 | Ratzel et al. | 342/173 |
| 7,216,276 B1 | * | 5/2007 | Azimi et al. | 714/733 |
| 7,385,384 B2 | | 6/2008 | Rocher | |
| 2006/0042853 A1 | * | 3/2006 | Hofbeck et al. | 180/272 |
| 2006/0055395 A1 | * | 3/2006 | Rocher | 324/123 R |
| 2007/0093211 A1 | * | 4/2007 | Plaumann | 455/67.14 |

FOREIGN PATENT DOCUMENTS

| | | |
|---|---|---|
| DE | 196 27 349 A1 | 1/1998 |
| DE | 198 20 207 A1 | 11/1999 |
| EP | 1 055 931 A2 | 11/2000 |
| JP | 5-90818 A | 4/1993 |
| JP | 2004-514373 A | 5/2004 |
| JP | 2006-501445 A | 1/2006 |
| WO | WO 2004/029639 A1 | 4/2004 |

OTHER PUBLICATIONS

Nissan FUGA service manual, document code SM4J1Y50J0, Oct. 2004, 11 pages.

* cited by examiner

*Primary Examiner* — Khoi Tran
*Assistant Examiner* — Bao Long T Nguyen
(74) *Attorney, Agent, or Firm* — Foley & Lardner LLP

(57) ABSTRACT

In diagnosis apparatus and method for diagnosing a vehicle antenna, the vehicle antenna performing transmission and reception of electric waves to and from a portable unit, the vehicle antenna is driven to perform communications with the portable unit when a first condition is satisfied and the vehicle antenna is driven to perform a diagnosis of a connection state of the vehicle antenna when a second condition is satisfied. The first condition is different from the second condition.

18 Claims, 4 Drawing Sheets

◄- - - - - - - DURING ENGINE STOP

DIAGNOSIS APPARATUS AND METHOD FOR DIAGNOSING CONNECTION STATE OF VEHICLE ANTENNA

BACKGROUND OF THE INVENTION (1) Background of the Invention

The present invention relates to diagnosis apparatus and method for diagnosing a connection state of a vehicle antenna, the vehicle antenna performing transmission and reception of electric waves between an in-board unit mounted in the vehicle and a portable unit for the vehicle.

(2) Description of Related Art

A system has been proposed which performs unlock and lock of a vehicular door lock mechanism and start and stop of an engine by communicating between the in-board unit and the portable unit and by performing an ID collation therebetween via the antenna. In the previously proposed system described above, an external exclusively used (or a dedicated) diagnosis device is connected to the system to determine whether the connection state of the in-board unit mounted in the vehicle to the vehicle antenna is normal (refer to a Japanese service manual for Nissan FUGA (document code: SM4J1Y50J0 published in October of 2004).

SUMMARY OF THE INVENTION

However, in the previously proposed system described above, it is necessary to connect the dedicated diagnosis device to the system. Hence, the diagnosis of the connection state of the vehicle antenna cannot easily be carried out.

It is, hence, an object of the present invention to provide diagnosis apparatus and method for diagnosing a connection state of a vehicle antenna which easily carry out the diagnosis of the connection state of the vehicle antenna with the vehicle antenna driven when a predetermined condition (a first condition) under which the vehicle antenna is driven to communicate the in-board unit with the portable unit via the antenna is not satisfied, namely, when a second condition under which the vehicle antenna is driven to diagnose the connection state of the vehicle antenna is satisfied.

According to one aspect of the present invention, there is provided a diagnosis apparatus for diagnosing a connection state of a vehicle antenna, the vehicle antenna performing transmission and reception of electric waves to and from a portable unit, the diagnosis apparatus comprising: a control section configured to drive the vehicle antenna to perform communications with the portable unit when a first condition is satisfied; and a diagnosis section configured to drive the vehicle antenna to perform a diagnosis of the connection state of the vehicle antenna when a second condition is satisfied.

According to another aspect of the present invention, there is provided a diagnosis method for diagnosing a connection state of a vehicle antenna, the vehicle antenna performing transmission and reception of electric waves to and from a portable unit, the diagnosis method comprising: driving the vehicle antenna to perform communications with the portable unit when a first condition is satisfied; and driving the vehicle antenna to perform a diagnosis of the connection state of the vehicle antenna when a second condition is satisfied.

According to the present invention, the vehicle antenna is driven to diagnose the connection state of the vehicle antenna when the first condition is not satisfied, namely, when the second condition is satisfied. Hence, the diagnosis of the vehicle antenna can easily be carried out. This summary of the invention does not necessarily describe all necessary features so that the invention may also be a sub-combination of these described features. The other objects and features of this invention will become understood from the following description with reference to the accompanying drawings.

DETAILED DESCRIPTION OF THE INVENTION

Reference will hereinafter be made to the drawings in order to facilitate a better understanding of the present invention.

Figure 1:
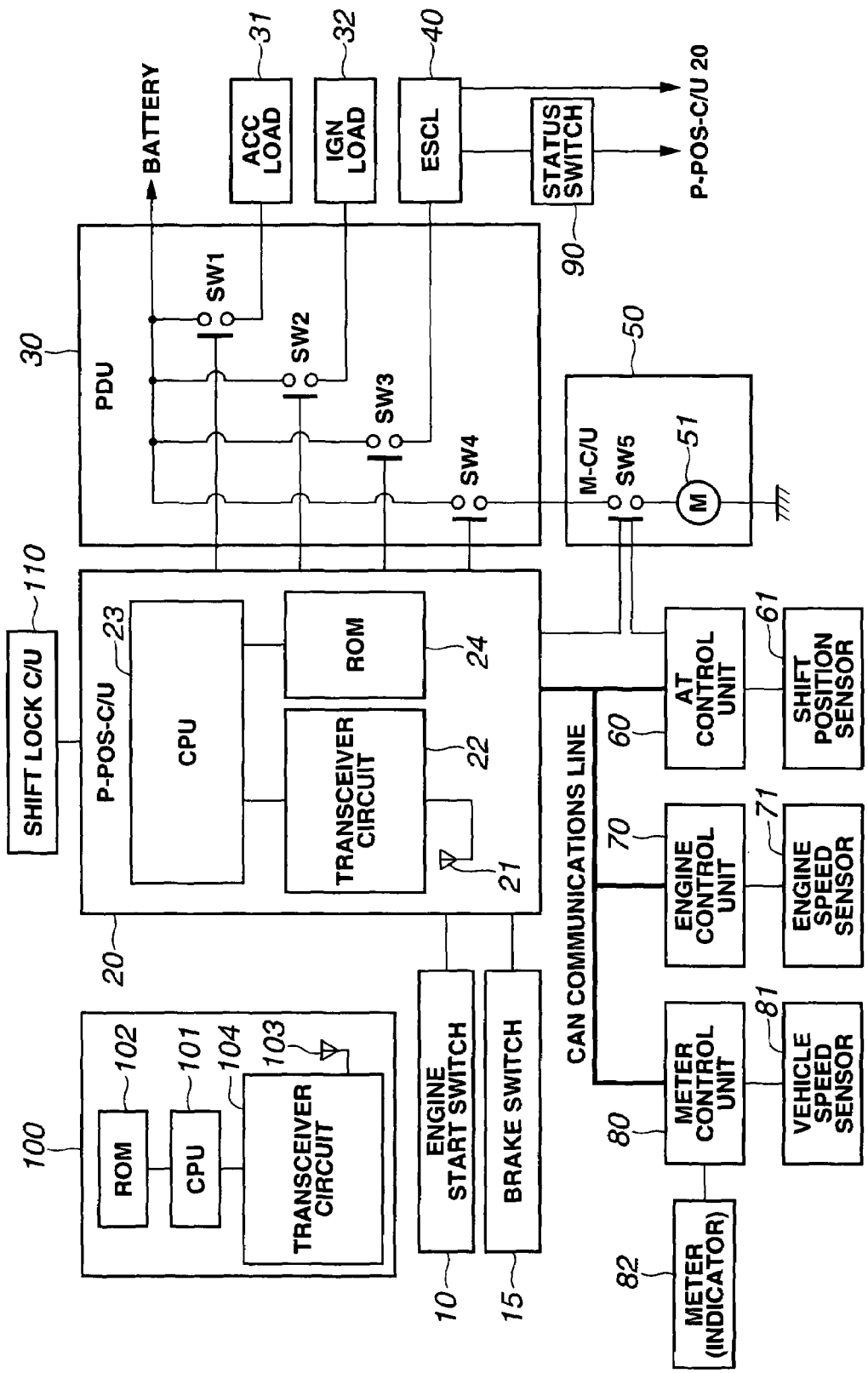
FIG. 1 is a schematic configuration view of a vehicle control system including a preferred embodiment of a diagnosis apparatus for diagnosing a connection state of a vehicle antenna according to the present invention.

FIG. 1 shows a schematic block diagram representing a whole structure of a vehicular control system including a diagnosis apparatus for diagnosing a connection state of a vehicle antenna in a preferred embodiment according to the present invention. An engine start switch 10 is of a push button type operated by a vehicular occupant when an engine (not shown) of the vehicle is started. When engine start switch 10 is pushed, with a predetermined condition (namely, a first condition) satisfied, a start control of the engine is initiated. Engine start switch 10 is used when any one of power supply positions is transferred as will be described later. A brake switch 15 is turned on when a brake (or a brake pedal) (not shown) is depressed (Brake is ON). Brake switch 15 is turned off when no brake (pedal) is depressed (Brake OFF).

A power supply position control unit (hereinafter, also referred to as a P-POS-C/U) 20 includes: an antenna (vehicle antenna) 21; a transceiver circuit 22; a CPU (Central Processing Unit) 23; and a ROM (Read Only Memory) 24. Transceiver circuit 22 performs transmission and reception of signals to and from a transceiver circuit 103 which is equipped within a portable key (or a portable unit) 100 via vehicle antenna 21. CPU 23 of P-POS-C/U 20 performs an ID collation between P-POS-C/U 20 and portable key 100, performs a control of power supply positions including a start control of the engine, and carries out a diagnosis of whether antenna 21 is normally connected to transceiver circuit 22. The details of the engine start control, the power supply position control, and the diagnosis of the connection state of vehicle antenna 21 will be described later. An ID (Identification) of portable key 100 is previously registered into ROM 24. It should be noted that the vehicular door lock-and-unlock is carried out using the ID stored into portable key 100 (ROM 102) and the ID registered (stored) in ROM 24 of P-POS-C/U 20. However, the detailed explanation thereon will herein be omitted. It should also be noted that portable key 100 includes a CPU 101, a transceiver circuit 104, and an antenna 103.

A diagnostic result to an effect that an abnormality occurs in the connection state of antenna 21 is also recorded in ROM 24 as a result of the connection state diagnosis of antenna 21 when the abnormality occurs in the connection state of antenna 21. In order to inform an user of an occurrence in the abnormality in the antenna connection state, an indicator within meter 82 connected to a meter control unit 80, as will be described later, is illuminated.

A PDU (Power Distribution Unit) 30 is equipped with first, second, third, fourth, and fifth (power supply position) switches SW1 through SW5 to modify the respective power supply positions. One end of each of switches SW1 through SW4 is connected to a battery and an on-and-off of each of switches SW1 through SW4 is carried out on the basis of a command issued from P-POS-C/U 20. The other end of switch SW1 is connected with an ACC load. When first switch SW1 is turned on, an electric power is supplied to ACC load 31. ACC load 31 is, for example, an audio system (not shown).

The other end of second (power supply position) switch SW2 is connected to an IGN load 32. When second switch SW2 is turned on, the electric power from the battery is supplied to an ignition load 32 (IGN load). IGN load 32 is, for example, an ignition device (not shown). The other end of third (power supply position) switch SW3 is connected to an electric power steering column lock (mechanism) 40 (hereinafter, also abbreviated as an ESCL). ESCL 40 performs a lock-and-unlock of a steering column (not shown) of a vehicle steering system. A status switch 90 is an switch which turns on or off on the basis of whether the steering column of the steering system of the vehicle is locked or unlocked. Status switch 90 and ESCL 40 are also connected to P-POS-C/U 20.

A motor control unit (M-C/U) 50 is equipped with a fifth (power supply position) switch SW5 and a starter motor 51. One end of fifth switch SW5 is connected to fourth (power supply position) switch SW4 and the other end of fifth switch SW5 is connected to starter motor 51. Fifth switch SW5 is turned on when an on command signal is outputted from P-POS-C/U 20 and a signal indicating that the shift position is placed at a P (Parking) range or an N (Neutral) range is outputted from an AT control unit 60 as will be described later. When switches SW4 and SW5 are turned on, the electric power from the battery is supplied to starter motor 51 to drive starter motor 51. Thus, an engine cranking is started to perform the engine start.

AT control unit 60 controls an automatic transmission (hereinafter, also abbreviated as an AT) of the vehicle. Shift position sensor 61 detects a shift (range) position and outputs the detected shift position to AT control unit 60.

An engine control unit 70 performs a control over the engine and outputs a signal indicating that the engine is under a start (or under a cranking) together with the control over the engine or a signal indicating a complete explosion which is a state in which the engine has started to P-POS-C/U 20. An engine speed sensor 71 detects an engine speed (a number of engine revolutions per unit time). A vehicle speed sensor 81 detects a vehicle speed. The detected vehicle speed is outputted to P-POS-C/U 20 via meter control unit 80. It should be noted that P-POS-C/U 20, AT control unit 60, engine control unit 70, and meter control unit 80 are interconnected via a CAN (Controller Area Network) communications line, respectively.

A shift lock control unit (shift lock C/U) 110 performs a shift lock for a shift lever of the automatic transmission not to move from a position of a P (Parking) range on the basis of a shift lock command issued from P-POS-C/U 20 and releases the shift lock on the basis of a shift lock release command issued from P-POS-C/U 20.

In a previously proposed engine start control apparatus, each of power supply positions is controlled on the basis of a pivoted position of an ignition key. However, in the control system shown in FIG. 1 in which the engine start is carried out in response to a push operation of engine start switch 10, a transition of one of the power supply positions to another of the power supply positions of a LOCK position, an OFF position, an ACC position, an IGN position, an ST position, and a RUN position is controlled by means of P-POS-C/U 20.

The LOCK position indicates a state in which the steering column (or a steering shaft) is locked and all power supply position switches SW1 through SW5 are turned off so that no power supply to each load which will be described later is carried out. The OFF position indicates a state in which the steering column (the steering shaft) is unlocked and no power supply to each load (all switches SW1 through SW5 are turned off) is carried out. The ACC position indicates a state in which the steering column is unlocked, first power supply position switch SW1 is turned on, and an electric power from the battery is supplied to an ACC load 31.

The IGN position indicates a state in which the steering column is unlocked and first and second power supply position switches SW1 and SW2 are turned on to supply the power to ACC load 31 and to IGN load 32. The ST position indicates a state in which the steering column is unlocked and second, fourth, and fifth power supply position switches SW2, SW4, and SW5 are turned on so that the electric power is supplied to IGN load 32 and starter motor 51. That is to say, in a case of the ST position, the engine cranking is being carried out. The RUN position indicates a state in which the steering column is unlocked, first, second, and fourth power supply position switches SW1, SW2, and SW4 are turned on, and a complete explosion state of the engine indicating that the engine has started occurs.

Figure 2:
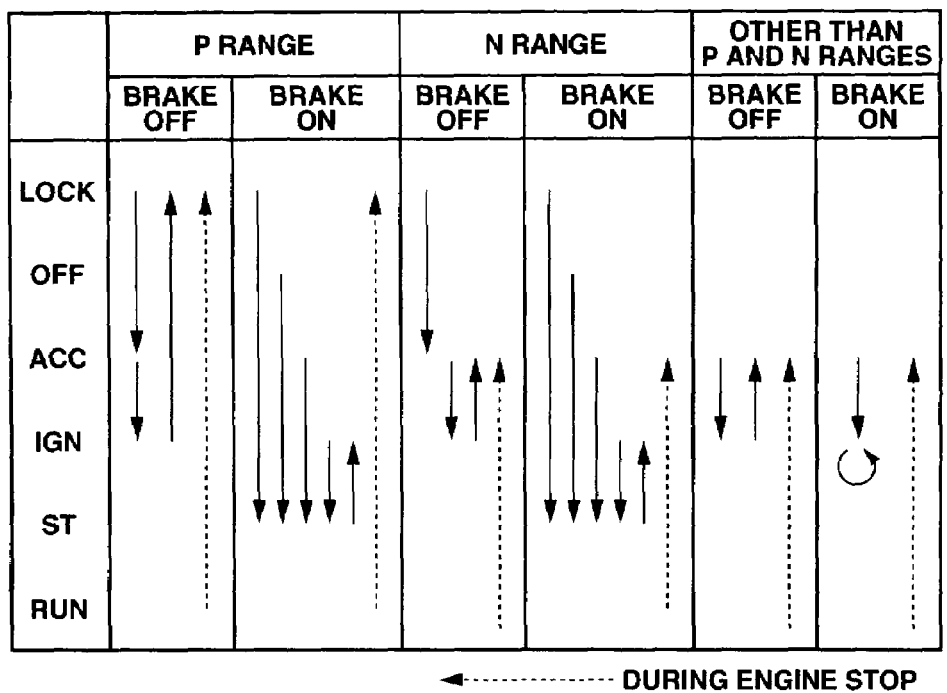
FIG. 2 is a transition state diagram to each power supply position of a LOCK position, an OFF position, an ACC position, an IGN position, an ST position, and a RUN position in a case where an engine start switch is pushed and a shift position of an automatic transmission is at a P (Parking) range, at an N (Neutral) range, and at any one range position other than the P and N ranges.

FIG. 2 shows a transition state of each of power supply positions of the LOCK position, the OFF position, the ACC position, the IGN position, the ST position, and the RUN position when engine start switch 10 is pushed in a case where the shift position of AT is placed at a position of P (Parking) range, N (Neutral) range, and at a position (range) except the P and N ranges.

<Shift position=P and in a state where the brake (pedal) is not depressed (brake switch 15 is turned off)>

When the shift position is placed at the P range and engine start switch 10 is pushed with no brake depressed (the brake pedal is not depressed (Brake OFF), namely, brake switch 15 is not turned on), the present power supply position is transferred from the LOCK position to the ACC position. When engine start switch 10 is, then, pushed in a state where the power supply position is at the ACC position without depression of brake (brake switch 15 is turned off), the power supply position is transferred to the IGN position. When engine start switch 10 is pushed without the brake depressed (brake switch 15 is turned off) in a state where the power supply position is at the IGN position or the RUN position, the power supply position is transferred to the LOCK position.

<Shift position=P and in a state where the brake is depressed (Brake ON) (brake switch 15 is turned on)>

When the shift position is placed at the P range and engine start switch 10 is pushed with the brake (pedal) depressed (brake switch 15 is turned on), the power supply position is transferred to the ST position to perform the cranking even if the power supply position is placed at any one of the LOCK position, the OFF position, the ACC position, and the IGN position. When, in a case where the power supply position is at the ST position, engine start switch 10 is pushed with the brake depressed (brake switch 15 is turned on), the power supply position is transferred to the IGN position. When, in a case where the power supply position is at the RUN position, engine start switch 10 is pushed with the brake depressed (brake switch 15 is turned on), the power supply position is transferred to the LOCK position.

<Shift position=N and the brake is not depressed (brake switch 15 is turned off)>
When, in a state where the shift position is placed at the N range and engine start switch 10 is pushed with no depression of the brake (brake switch 15 is turned off), the power supply position is transferred from the LOCK position to the ACC position. If engine start switch 10 is pushed with no brake depression (brake switch 15 is turned off) in a state where the power supply position is at the ACC position, the power supply position is transferred to the IGN position. If engine start switch 10 is pushed with no brake depressed in a state where the power supply position is at the IGN position, the power supply position is transferred to the ACC position. In addition, when engine start switch 10 is pushed without depression of the brake (brake switch 15 is turned off) in a state where the power supply position is at the RUN position, the power supply position is transferred to the ACC position.

<Shift position=N and in a state where the brake is depressed (brake switch 15 is turned on)>
If the shift position is placed at the N range and engine start switch 10 is pushed with the brake (pedal) depressed (brake switch 15 is turned on), the power supply position is transferred to the ST position to perform the cranking even if the power supply position is placed at any one of the LOCK, the OFF, the ACC, and the IGN positions. If engine start switch 10 is pushed in a state where the brake is depressed (brake switch 15 us turned on) in a case where the power supply position is at the ST position, the power supply position is transferred to the IGN position. In addition, if engine start switch 10 is pushed with the brake (pedal) depressed in a state where the power supply position is placed at the RUN position, the power supply position is transferred to the ACC position.

<Shift position is placed at any other position than the P and N ranges and no brake is depressed (Brake OFF)>
When the shift position is placed at the position other than the P and N ranges and engine start switch 10 is pushed, in a state where the brake is depressed (brake switch 15 is turned on), the power supply position at the ACC position is transferred to the IGN position and the power supply position at the IGN position is transferred to the ACC position. In addition, if engine start switch 10 is pushed without depression of the brake (brake switch 15 is turned off) in a state where the power supply position is placed at the RUN position, the power supply position is transferred to the ACC position.

<Shift position is at any one of the range positions other than P and N ranges and the brake is depressed (Brake ON) (brake switch 15 is turned on)>
If the shift position is at any one of the positions other than P and N ranges and engine start switch 10 is pushed with the brake depressed (brake switch 15 is turned on), the power supply position placed at the ACC position is transferred to the IGN position. If engine start switch 10 is pushed in a state where the power supply position is at the IGN position with the brake depressed (brake switch 15 is turned on), the power supply position is held at the IGN position without transfer of the power supply position. In addition, in a state where the power supply position is at the RUN position, engine start switch 10 is pushed with the brake depressed (brake switch 15 is turned on), the power supply position is transferred to the ACC position.

Figure 3:
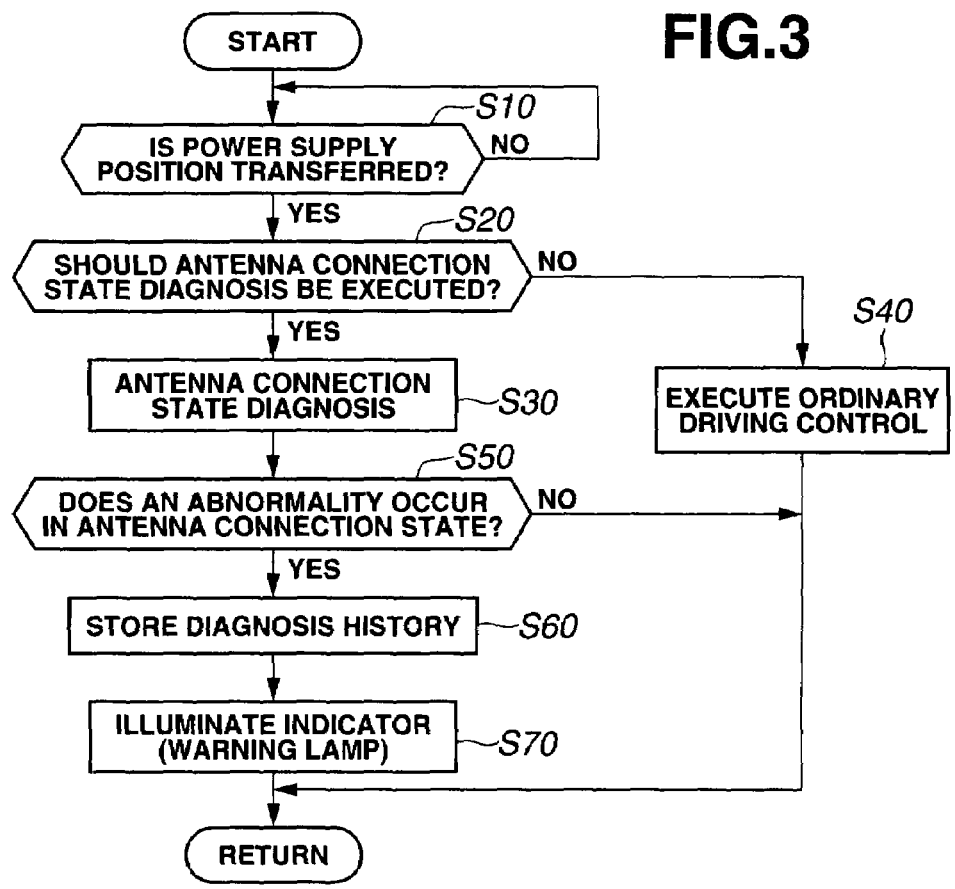
FIG. 3 is a flowchart representing processing contents carried out by the diagnosis apparatus for diagnosing the connection state of the vehicle antenna in the preferred embodiment shown in FIG. 1.

FIG. 3 shows a flowchart representing the processing contents carried out by the diagnosis apparatus and method for diagnosing the connection state of the vehicle antenna in the preferred embodiment according to the present invention. The contents of diagnosis of the connection state of vehicle antenna 21 includes a determination of whether an output generated by transceiver circuit 22 shown in FIG. 1 does not arrive at antenna 21. The details thereof will be described later. Whenever a constant period of time has passed or when an operation input of engine start switch 10 occurs, CPU 23 of P-POS-C/U 20 starts a processing of FIG. 3. That is to say, at a step S10, CPU 23 of P-POS-C/U 20 determines if a command to transfer the present power supply position is inputted to CPU 23. For example, if engine start switch 10 is pushed, CPU 23 of P-POS-C/U 20 determines that the transfer control of the power supply positions, as described with reference to FIG. 2, is executed. Therefore, CPU 23 of P-POS-C/U 20 determines that the command to transfer the present power supply position is inputted when engine start switch 10 is pushed. If CPU 23 of P-POS-C/U 20 determines that no command to transfer the present power supply position is inputted (No), the routine waits until the command to transfer the present power supply position is inputted. If CPU 23 of P-POS-C/U 20 determines that the command to transfer the present power supply position is inputted, the routine goes to a step S20.

Figure 4:
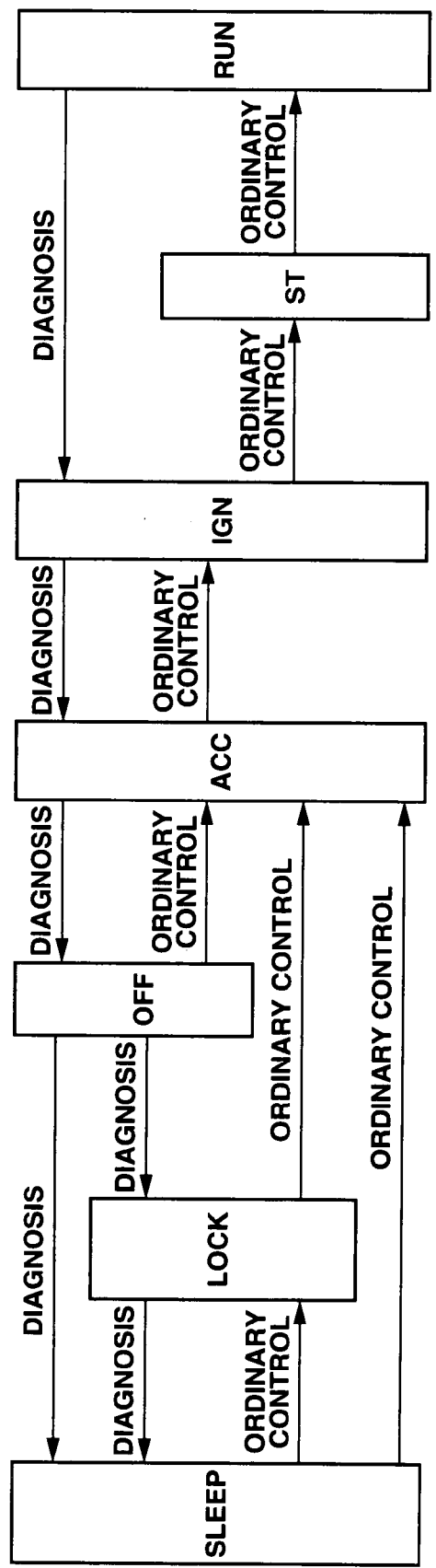
FIG. 4 is a state diagram representing a relationship between transitions of respective power supply positions and timings at each of which the diagnosis of the connection state of the vehicle antenna is carried out.

At step S20, CPU 23 of P-POS-C/U 20 determines whether the diagnosis of the connection state of vehicle antenna 21 should be executed. A method of this determination will be explained with reference to FIG. 4. FIG. 4 shows a state transition diagram representing a relationship between the transfer of each power supply position and a timing at which the diagnosis of the connection state of antenna 21 is executed. As shown in FIG. 4, a timing at which the connection state diagnosis is executed is when the power supply position is transferred from an engine start direction into an opposite direction thereof, i.e., when the present power supply position is transferred toward an engine stop direction. Specifically, as shown in FIG. 4, the power supply position is transferred from the RUN position to the IGN position, from the IGN position to the ACC position, from the ACC position to the OFF position, from the OFF position to the SLEEP position, from the OFF position to the LOCK position, and from the LOCK position to the SLEEP position. It should be noted that the SLEEP position indicates a state in which the power supply of P-POS-C/U 20 is in a sleep mode (so-called, a low power consumption mode).

On the contrary, when the power supply position is transferred toward the engine start direction, an ordinary antenna driving control (an ordinary control) is executed. It should be noted that when the power supply position is transferred toward the engine start direction means when the power supply position is transferred from the SLEEP position to the LOCK position, from the SLEEP position to the ACC position, from the LOCK position to the ACC position, from the ACC position to the IGN position, from the OFF position to the ACC position, from the IGN position to the ST position, and from the ST position to the RUN position.

As described with reference to FIG. 2, P-POS-C/U 20 controls the transfer of the present power supply position to one of the other power supply positions on the basis of the shift position of AT and one of the power supply positions at a time at which engine start switch 10 is pushed and whether the brake (pedal) is depressed (brake switch 15 is turned on). In a case where the transfer of power supply position corresponds to any one of the cases where the power supply position is transferred from the RUN position to the IGN position, from the ACC position to the OFF position, from the OFF position to the SLEEP position, from the OFF position to the LOCK position, and from the LOCK position to the SLEEP position, CPU 23 of P-POS-C/U 20 determines that the connection state diagnosis of antenna 21 should be executed at step S20. If CPU 23 of P-POS-C/U 20 determines that the diagnosis of the connection state of antenna 21 should be executed, the routine goes to a step S30. If CPU 23 does not determine that the diagnosis of the connection state of antenna 21 should be executed (No) at step S20, the routine goes to a step S40.

At step S40, the ordinary antenna driving control (the ordinary control) is executed. In the ordinary antenna driving control, the ID (Identification) collation between the registered (stored) ID in ROM 24 and the ID of portable key 100 is carried out. At this time, if, for example, the present power supply position is placed at the LOCK position, the shift position is placed in the P range, brake switch 15 is turned on, and engine start switch 10 is pushed, the power supply position is placed toward the RUN position via the LOCK, the OFF, the ACC, the IGN, and the ST positions. The ID collation of portable key 100 with the registered (stored) ID in ROM 24 is carried out only during a first transition from the LOCK position to the OFF position. That is to say, in a case where the plurality of the power supply positions are continuously transferred, the ID collation is carried out only at a first power supply position transition. In a case where the present power supply position is transferred only to the next position, the ID collation is carried out at the time of the transition to the next position.

Figure 6A:
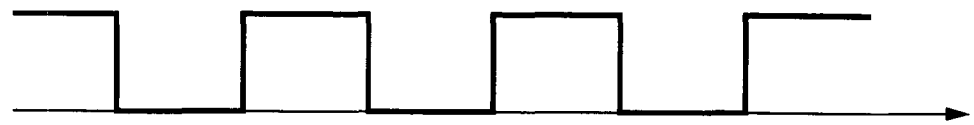
FIGS. 6A and 6B are examples of output waveforms of the vehicle antenna when an ordinary antenna driving control (an ordinary control) is executed and when the diagnosis of the connection state of the vehicle antenna in the preferred embodiment is executed, respectively.
Figure 6B:
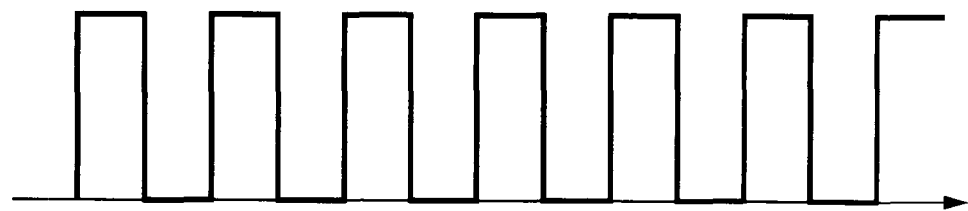

On the other hand, at step S30, CPU 23 of P-POS-C/U 20 diagnoses (determines) whether antenna 21 is normally connected to transceiver circuit 22. The antenna output (power) during the time of the connection state diagnosis described above is set to be larger than an output (power) (a normal output) during a time of at least at the ordinary antenna driving control, as shown in FIGS. 6A and 6B. FIG. 6A shows a desired output waveform of vehicle antenna 21 when the ordinary driving control of antenna 21 is executed. In the ordinary driving control, the output of a pulsed waveform via antenna 21 is carried out a plural number of times (in this case, four times) at a predetermined interval of time. FIG. 6B shows the output waveform of vehicle antenna 21 when the connection state diagnosis at step S30 is executed. In the case of FIG. 6B, the output of antenna 21 is carried out at a shorter interval of time of an on-and-off of the signal than that in the ordinary driving control. At this time, P-POS-C/U 20 outputs a command for the output (power) of antenna 21 to indicate a maximum (output power) (refer to FIG. 6B). In addition, an output waveform of antenna 21 during the diagnosis of the connection state of antenna 21 is driven to be different from the output waveform during the time at which antenna 21 is ordinarily driven (the ordinary driving control), as shown in FIGS. 6A and 6B. This is because, during the diagnosis of the connection state of antenna 21, even in a case where the electric wave transmitted from antenna 21 during the diagnosis of the connection state of vehicle antenna 21 is received by portable key 100, portable key 100 is not responded thereto. That is to say, the output waveform of antenna 21 during the diagnosis of the connection state of vehicle antenna 21 is an output waveform by which portable key 100 cannot be recognized.

Figure 5A:
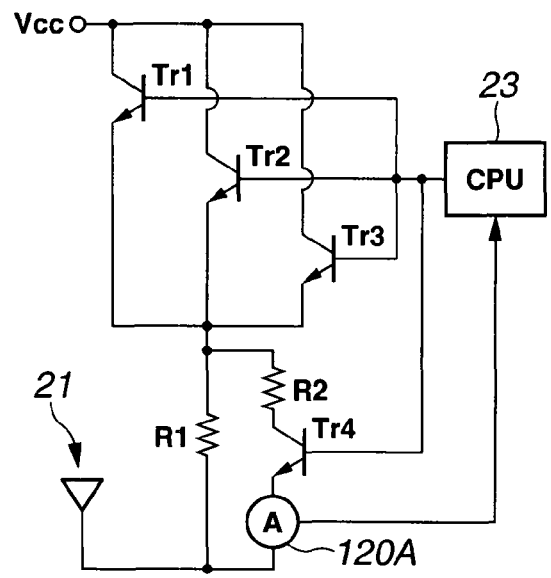
FIGS. 5A and 5B are examples of circuit connection diagrams of portions of the diagnosis apparatus for diagnosing the connection state of the vehicle antenna, respectively.
Figure 5B:
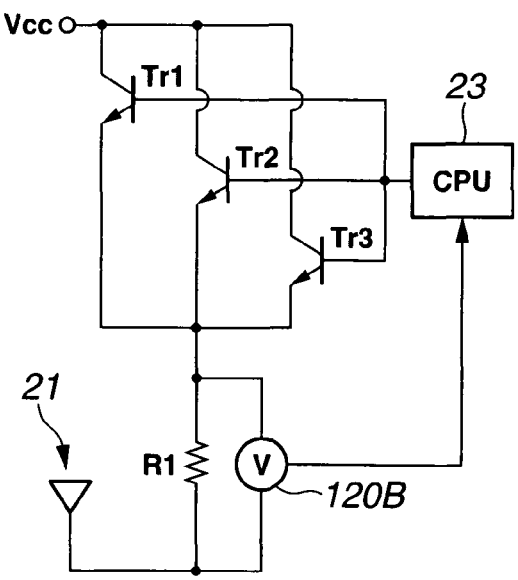

The determination of whether antenna 21 is normally connected or not is carried out as follows: That is to say, when, with a transistor Tr4 to detect a drive current through a resistor R1 or resistor R1 used to detect a drive voltage of antenna 21 installed in transceiver circuit 22 (refer to FIGS. 5A and 5B), a drive current detected by a current sensor 120A or a drive voltage detected by a voltage sensor 120B is smaller or lower than a predetermined value even if the output command to drive vehicle antenna 21 is outputted from CPU 23 of P-POS-C/U 20, CPU 23 of P-POS-C/U 20 determines that the abnormality in the connection state of vehicle antenna 21 occurs. Since, as described above, the command for the antenna output during the diagnosis of the connection state to be the maximum output is issued, a determination accuracy of the connection state diagnosis can become high. It should be noted that FIGS. 5A and 5B show two examples of portions of transceiver circuit 22, CPU 23, and vehicle antenna 21 designed only for the connection state diagnosis in the control system shown in FIG. 1. The contents of the diagnosis of the connection state are whether the output generated by transceiver circuit 22 does not arrive at antenna 21 so that the desired electric wave is not outputted as described above. Especially, causes of no output of the desired electric wave from antenna 21 include a case where CPU 23 of P-POS-C/U 20 fails (a malfunction of CPU 23) and, therefore, the command cannot be issued to transceiver circuit 22, a case where signals cannot be outputted to antenna 21 in spite of the fact that transceiver circuit 22 receives the corresponding command for the diagnosis purpose, and a case where the connection between transceiver circuit 22 and antenna 21 is broken (disconnected state). In FIG. 5A, a power supply voltage Vcc is given to a plurality of transistors (in FIG. 5A, for convenience, three transistors Tr1, Tr2, and Tr3) and a base of each of transistors Tr1, Tr2, and Tr3 receives the corresponding command from CPU 23 of P-POS-C/U 20. If this command from CPU 23 is at a "H" (high) level, transistors Tr1, Tr2, and Tr3 are turned on. In the ordinary driving control, only one of the plurality of transistors is turned on so that the output of antenna 21, in other words, a current flowing through transceiver circuit 22 and antenna 21 is suppressed. In the case of the execution of the connection state diagnosis, all of these transistors (Tr1, Tr2, and Tr3) are turned on to maximize the output of antenna 21 (flowing current). A total sum of the currents flowing through these respective transistors is distributed by resistance values of their subsequent stage resistors R1 and R2. The distributed current is detected by means of a current sensor 120A. Then, the diagnosis of the connection state of antenna 21 is executed by determining whether the current detected by current sensor 120A is equal to or larger than the predetermined value. It should be noted that transistor Tr4 is turned on only when the above-described current detection by means of current sensor 120A and, in other words, transistor Tr4 is turned on in synchronization with the turning on of all of these transistors Tr1, Tr2, and Tr3. A concept of the voltage detection shown in FIG. 5B is generally the same as the case of FIG. 5A. The diagnosis of the connection state of antenna 21 is, in the case of FIG. 5B, executed by determining whether the voltage detected by a voltage sensor 120B is equal to or higher than another predetermined value. The result of the current detected by current sensor 120A or the voltage detected by voltage sensor 120B is supplied to CPU 23.

If the connection state diagnosis of antenna 21 is carried out at step S30, the routine goes to a step S50. At step S50, CPU 23 of P-POS-C/U 20 determines whether the abnormality occurs in the connection state of antenna 21 as the result of diagnosis carried out at step S30. When CPU 23 of P-POS-C/U 20 determines that the abnormality occurs in the connection state of antenna 21, the routine goes to a step S60. If CPU 23 of P-POS-C/U 20 determines that no abnormality in the connection state of antenna 21 occurs (normal), the routine returns to step S10.

At step S60, CPU 23 of P-POS-C/U 20 records the diagnosis result that the abnormality in the connection state of antenna 21 occurs to ROM 24 and the routine goes to a step S70. At step S70, CPU 23 of P-POS-C/U 20 illuminates the indicator within meter 82 to inform a user that the abnormality of the connection state in antenna 21 occurs.

In the diagnosis apparatus of the connection state of vehicle antenna 21 in the preferred embodiment, when the predetermined condition (the first condition) is satisfied, vehicle antenna 21 is driven to perform transmission and reception of electric waves to and from portable key 100. If the predetermined condition is not satisfied (if the second condition different from the predetermined condition (the first condition)) is satisfied, vehicle antenna 21 is driven to perform the diagnosis of the connection state of vehicle antenna 21. Hence, the diagnosis of the connection state of vehicle antenna 21 can easily be carried out without use of the self-contained (or the dedicated) diagnosis device. In addition, when no predetermined condition is satisfied (the second condition is satisfied), namely, when no ordinary driving control of vehicle antenna 21 is carried out, the diagnosis of the connection state of vehicle antenna 21 is carried out. Hence, no influence is given to the ordinary driving control of vehicle antenna 21.

In addition, in the diagnosis apparatus for diagnosing the connection state of the vehicle antenna in the preferred embodiment, vehicle antenna 21 is driven for the antenna output (power) at the time of the diagnosis of the connection state of vehicle antenna 21 to be larger than the output (power) of vehicle antenna 21 when vehicle antenna 21 is ordinarily driven. Especially, vehicle antenna 21 is driven to maximize the output of vehicle antenna 21 at the time of connection state diagnosis. Hence, the diagnosis of the connection state of the vehicle antenna can accurately be carried out.

In addition, in the connection state diagnosis apparatus in the preferred embodiment, vehicle antenna 21 is driven for the output waveform of the antenna during the diagnosis of the connection state to be different from the output waveform when vehicle antenna 21 is ordinarily driven. Especially, since the output waveform of the antenna during the diagnosis of the connection state indicates an output waveform that cannot be recognized by portable key 100, portable key 100 cannot respond even in a case where the electric wave transmitted from vehicle antenna 21 is received by portable key 100.

Furthermore, in the diagnosis apparatus for the connection state of vehicle antenna 21 in the preferred embodiment, in a case where CPU 23 of P-POS-C/U 20 diagnoses (determines) that the abnormality in the connection state of vehicle antenna 21 occurs, P-POS-C/U 20 informs the user that the abnormality in the connection state of vehicle antenna occurs. Hence, the user can easily be recognized that the abnormality in the connection state of vehicle antenna 21 occurs.

The present invention is not limited to the above-described embodiment. For example, the ordinary driving control of antenna 21 is carried out at a time when the power supply position is transferred toward the engine start direction. Then, in the embodiment described above, the diagnosis of the connection state of vehicle antenna 21 is carried out when the power supply position is transferred toward the opposite direction to the engine start direction. However, the timing at which the connection state diagnosis is carried out may be a timing at which no ordinary driving control of vehicle antenna 21 is carried out and not limited to the timing at which the power supply position is transferred toward the opposite position to the engine start position. For example, the diagnosis of the connection state of the vehicle antenna may be carried out when electrically operated rear view mirrors (attached on front doors of the vehicle) are moved toward their closure positions.

CPU 23 of P-POS-C/U 20 can inhibit the ordinary driving control of antenna 21 if the abnormality of the connection state of vehicle antenna 21 occurs. In a case where the abnormality of the connection state of vehicle antenna 21 occurs, there is a possibility of an inaccurate ID collation. However, since the ordinary driving control of antenna 21 is inhibited when the abnormality described above occurs, the inaccurate ID collation can be prevented from being carried out.

The output of the antenna during the diagnosis of the connection state of antenna 21 indicates the maximum output. If the diagnosis of the connection state of the vehicle antenna can be carried out with high accuracy, the present invention is not limited to the maximum output.

The method of informing the user that the abnormality occurs in the connection state of antenna 21 is not limited to the method in which the indicator (warning lamp) within meter 82 is illuminated. For example, a warning sound may be issued from a speaker (not shown) and a synthesis voice may be used to inform the user that the abnormality in the connection state of the vehicle antenna occurs.

Correspondence relationships between components in the claims and the elements in the embodiment are as follows: That is to say, P-POS-C/U 20 corresponds to a control section, a diagnosis section, and a control inhibiting section, ROM 24 corresponds to a recording section, and meter 82 (indicator) corresponds to an informing section. It should be noted that the above explanation is merely one example and, when the present invention is interpreted, the present invention is not limited to the correspondence relationship between the elements in the preferred embodiment and the elements in the present invention. It should be noted that the above-described embodiment is described in order to facilitate a better understanding of the present invention and do not limit the scope of the present invention. Hence, each essential element disclosed in the above-described embodiment includes all design modifications and equivalents belonging to the scope of the present invention. This application is based on a prior Japanese Patent Application No. 2006-186611. The entire contents of a Japanese Patent Application No. 2006-186611 with a filing date of Jul. 6, 2007 are hereby incorporated by reference. Although the invention has been described above by reference to certain embodiments of the invention, the invention is not limited to the embodiment described above. Modifications and variations of the embodiments described above will occur to those skilled in the art in light of the above teachings. The scope of the invention is defined with reference to the following claims.

What is claimed is:

1. A diagnosis apparatus for diagnosing a connection state of a vehicle antenna, the vehicle antenna performing transmission and reception to and from a portable key, the diagnosis apparatus being configured to be mounted in a vehicle and comprising:

a control section configured to drive the vehicle antenna to perform communications with the portable key when a first condition is satisfied; and a diagnosis section configured to drive the vehicle antenna to perform a diagnosis of the connection state of the vehicle antenna when a second condition is satisfied, wherein the diagnosis section is configured to output a command to drive the vehicle antenna to output an output waveform that cannot be recognized by the portable key, and wherein the diagnosis section is configured to output a command to drive the vehicle antenna such that an output power of the vehicle antenna during the diagnosis is larger than an output power of the vehicle antenna when the vehicle antenna is driven by the control section.

2. The diagnosis apparatus as claimed in claim 1, wherein the diagnosis section outputs a command to drive the vehicle antenna such that an output power of the vehicle antenna during the diagnosis is at a maximum.

3. The diagnosis apparatus as claimed in claim 1, wherein the first condition is different from the second condition.

4. The diagnosis apparatus as claimed in claim 3, wherein a satisfaction of the first condition includes a state of transition of a plurality of power supply positions toward an engine start direction and the satisfaction of the second condition includes another state of transition of the plurality of the power supply positions toward a direction opposite to the engine start direction.

5. The diagnosis apparatus as claimed in claim 4, wherein the satisfaction of the second condition includes at least one state of transition of each of the power supply positions from a RUN position to an IGN position, from the IGN position to an ACC position, from the ACC position to an OFF position, from the OFF position to a SLEEP position, from the OFF position to a LOCK position, and from the LOCK position to the SLEEP position.

6. The diagnosis apparatus as claimed in claim 5, wherein:

the SLEEP position, the LOCK position, the OFF position, the ACC position, the IGN position, an ST position, and the RUN position are defined depending on whether a plurality of power supply position switches are turned on or off, the SLEEP position is a state in which a power supply of the control section is in a sleep mode, the LOCK position is a state in which a steering column of a steering system of the vehicle is locked and the plurality of power supply position switches to supply an electric power to respective loads are turned off, the OFF position is a state in which the steering column is unlocked and the plurality of power supply position switches are turned off, the ACC position is a state in which the steering column is unlocked and a first power supply position switch to supply a power to an ACC load is turned on, the IGN position is a state in which the steering column is unlocked and the first power supply position switch is turned on and a second power supply position switch to supply the electrical power to an IGN load is turned on, the ST position is a state in which the steering column is unlocked, the second power supply position switch is turned on, and fourth and fifth power supply position switches are turned on to supply power to a starter motor, and the RUN position is a state in which the steering column is unlocked and first, second, third, and fourth power supply position switches are turned on and in which the engine has started.

7. The diagnosis apparatus as claimed in claim 1, wherein the diagnosis section is configured to output a command to drive the vehicle antenna such that an output waveform of the vehicle antenna during the diagnosis is different from an output waveform of the vehicle antenna when the vehicle antenna is driven by the control section.

8. The diagnosis apparatus as claimed in claim 1, wherein the diagnosis apparatus further comprises a recording section configured to record a result of the diagnosis of the connection state of the vehicle antenna carried out by the diagnosis section.

9. The diagnosis apparatus as claimed in claim 1, wherein the diagnosis apparatus further comprises an informing section configured to inform a user that an abnormality occurs in the connection state of the vehicle antenna when the diagnosis section determines that the abnormality occurs in the connection state of the vehicle antenna.

10. The diagnosis apparatus as claimed in claim 9, wherein the diagnosis section includes a current sensor configured to detect a current flowing into the vehicle antenna and the diagnosis section determines that the abnormality occurs in the connection state of the antenna when the current sensor detects that the detected current is smaller than a predetermined value.

11. The diagnosis apparatus as claimed in claim 9, wherein the diagnosis section includes a voltage sensor configured to detect a voltage applied to the vehicle antenna and the diagnosis section determines that the abnormality occurs in the connection state of the antenna when the voltage sensor detects that the detected voltage is lower than a predetermined value.

12. The diagnosis apparatus as claimed in claim 1, wherein the diagnosis apparatus further comprises a control inhibiting section configured to inhibit the drive of the vehicle antenna by the control section when the diagnosis section determines that an abnormality occurs in the connection state of the vehicle antenna.

13. The diagnosis apparatus as claimed in claim 1, wherein the control section and the diagnosis section are parts of a power supply position control unit.

14. The diagnosis apparatus as claimed in claim 8, wherein the recording section includes a ROM of a power supply position control unit.

15. The diagnosis apparatus as claimed in claim 12, wherein the control inhibiting section is a part of a power supply position control unit.

16. The diagnosis apparatus as claimed in claim 13, wherein the power supply position control unit performs a power supply position control on the basis of a shift range position of an automatic transmission, whether an operation of an engine start switch is inputted, and whether a brake switch is turned on.

17. A diagnosis apparatus for diagnosing a connection state of a vehicle antenna, the vehicle antenna performing transmission and reception to and from a portable key, the diagnosis apparatus being configured to be mounted in a vehicle and comprising:

control means for driving the vehicle antenna to perform communications with the portable key via the vehicle antenna when a first condition is satisfied; and diagnosis means for driving the vehicle antenna to perform a diagnosis of the connection state of the vehicle antenna when a second condition is satisfied, wherein the diagnosis means is configured to output a command to drive the vehicle antenna to output an output waveform that cannot be recognized by the portable key, and wherein the diagnosis means is configured to output a command to drive the vehicle antenna such that an output power of the vehicle antenna during the diagnosis is larger than an output power of the vehicle antenna when the vehicle antenna is driven by the control means.

18. A diagnosis method performed by a processor for diagnosing a connection state of a vehicle antenna, the vehicle antenna performing transmission and reception to and from a portable key, the diagnosis method being performed in a vehicle and comprising:

using a control section to drive the vehicle antenna to perform communications with the portable key when a first condition is satisfied; and using a diagnosis section to drive the vehicle antenna to perform a diagnosis of the connection state of the vehicle antenna when a second condition is satisfied, wherein the diagnosis section is configured to output a command to drive the vehicle antenna to output an output waveform that cannot be recognized by the portable key, and wherein the diagnosis section is configured to output a command to drive the vehicle antenna such that an output power of the vehicle antenna during the diagnosis is larger than an output power of the vehicle antenna when the vehicle antenna is driven by the control section.

* * * * *